United States Patent [19]
Tamaki et al.

[11] Patent Number: 5,377,155
[45] Date of Patent: Dec. 27, 1994

[54] SERIAL ACCESS SEMICONDUCTOR MEMORY HAVING A REDUCED NUMBER OF DATA REGISTERS

[75] Inventors: Satoshi Tamaki; Naomi Yonezawa, both of Tokyo, Japan

[73] Assignee: NEC Corporation, Tokyo, Japan

[21] Appl. No.: 191,922

[22] Filed: Feb. 4, 1994

[30] Foreign Application Priority Data

Feb. 4, 1993 [JP] Japan .................... 5-017157

[51] Int. Cl.$^5$ ............................................. G11C 7/00
[52] U.S. Cl. .............................. 365/221; 365/189.12
[58] Field of Search .............. 365/221, 189.12, 189.05, 365/190, 207

[56] References Cited

U.S. PATENT DOCUMENTS

| | | | |
|---|---|---|---|
| 4,646,272 | 2/1987 | Takasugi | 365/233 |
| 5,289,413 | 2/1994 | Tsuchida | 365/189.02 |

Primary Examiner—Eugene R. LaRoche
Assistant Examiner—A. Zarabian
Attorney, Agent, or Firm—Sughrue, Mion, Zinn, Macpeak & Seas

[57] ABSTRACT

In a serial access semiconductor memory, each four bit line pairs of a memory cell array are connected to corresponding four sense amplifiers, respectively, and are connected to each one data register through corresponding four transfer gates controlled by four different data transfer control signal lines, respectively, so that the four bit line pairs are sequentially connected to the data register one at a time, by sequentially activating the four different data transfer control signal lines one at a time. Thus, the required number of the data registers can be reduced to one fourth of the number of the sense amplifiers and hence the bit lines pairs of the memory cell array.

8 Claims, 3 Drawing Sheets

SERIAL ACCESS SEMICONDUCTOR MEMORY HAVING A REDUCED NUMBER OF DATA REGISTERS

BACKGROUND OF THE INVENTION

1. Field of the invention

The present invention relates to a semiconductor memory, and more specifically to a semiconductor memory organized in the form of a serial access memory having a serial port.

2. Description of related art

Figure 1:
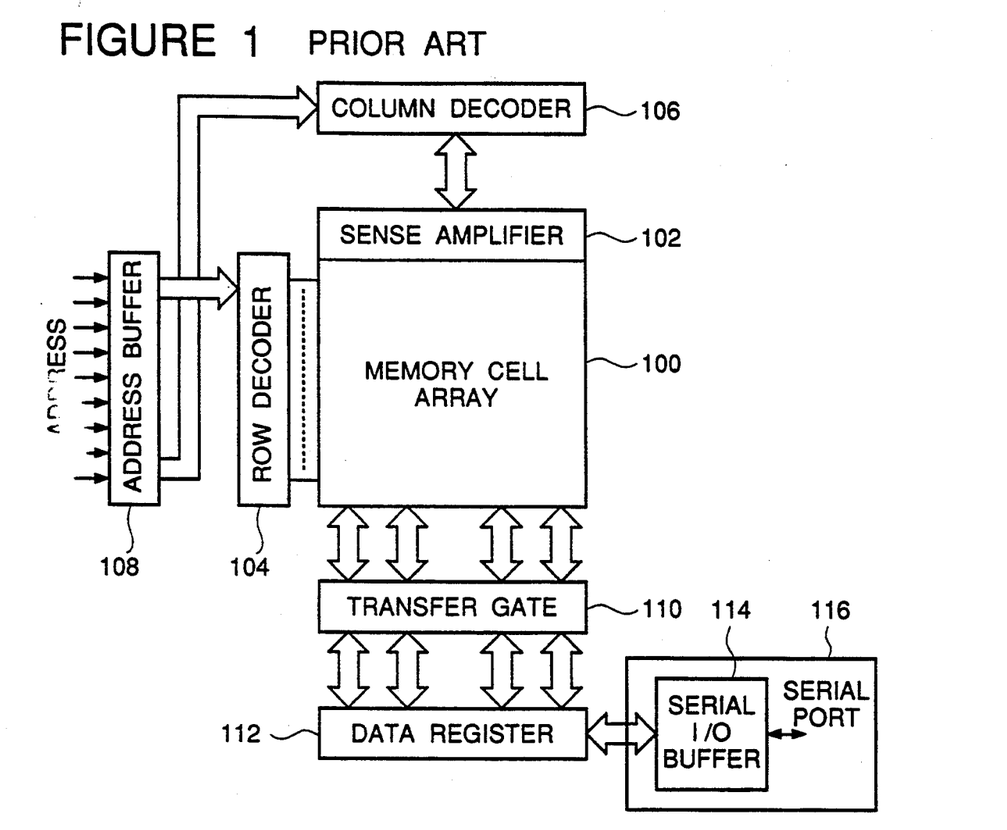
FIG. 1 is a conceptional diagram showing a fundamental construction of the semiconductor memory organized in the form of a serial access memory having a serial port.

Referring to FIG. 1, there is shown a conceptional diagram showing a fundamental construction of the semiconductor memory organized in the form of a serial access memory having a serial port.

The shown memory includes a memory cell array 100 formed of a matrix of a number of memory cells (not shown) having a number of rows and a number of clumns, and a sense amplifier group 102 including a number of sense amplifiers each of which is connected to a pair of complementary bit lines of a corresponding one of the columns.

The memory cell array 100 is associated with a row decoder 104 and a column decoder 106, which are coupled to an address buffer 108 so as to receive respective corresponding portions of an address held in the address buffer 108. Furthermore, all the bit lines of the memory cell array 100 are connected through a transfer gate group 110 to a data register group 112, which is in turn connected to a serial input/output buffer 114 of a serial port 116.

With the above mentioned arrangement, data read from the memory cell array 100 is transferred in parallel through the transfer gate group 110, and temporarily held in the data register group 112 in parallel. The data temporarily held in the data register group 112 in serially outputted through the serial input/output buffer 114. On the other hand, data to be written to the memory cell array 100 is serially transferred through the serial input/output buffer 114 and temporarily held in the data register group 112. The data temporarily held in the data register group 112 is transferred in parallel through the transfer gate group 110, and written to the memory cell array 100.

The above mentioned construction and operation are merely fundamental construction and operation. However, since a detailed construction and operation of the serial access memory is known to persons in the art, explanation of the detailed construction, including control signal lines, and the detailed operation, will be omitted.

Figure 2:
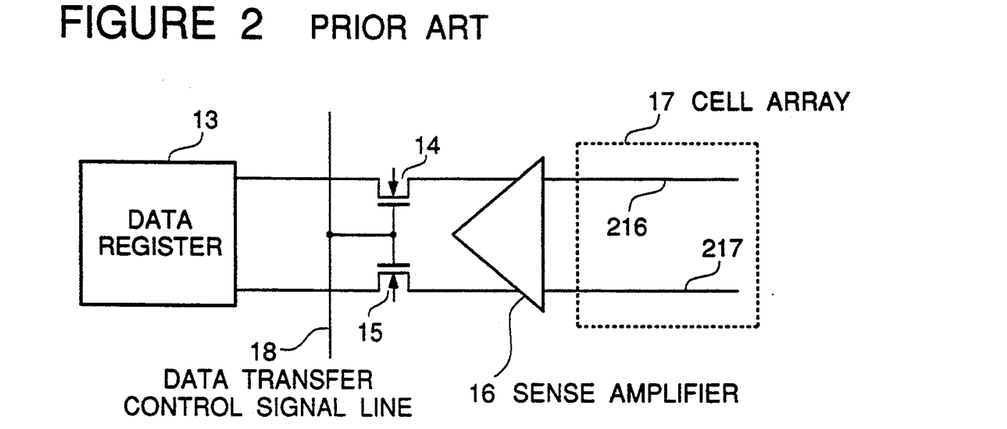
FIG. 2 is a block diagram of a portion of a data register circuit which can be incorporated in the serial access memory shown in FIG. 1.

Turning to FIG. 2, there is shown a block diagram of a portion of a data register circuit incorporated for example in the serial access memory shown in FIG. 1. The shown data register circuit portion includes a data register 13 having a pair of input/output terminals connected to a drain of a pair of NMOS transistors 14 and 15, respectively, which have their gate connected to a data transfer control signal line 18. A source of the NMOS transistors 14 and 15 are connected through a sense amplifier 16 to a pair of complementary bit lines 216 and 217 extending from a memory cell array 17. Thus, the pair of NMOS transistors 14 and 15 constitute a transfer gate between the data register 13 and the memory cell array 17.

In this shown data register circuit portion, it may be considered that the data register 13 constitutes a minimum register stage of the data register group 112, the pair of NMOS transistors 14 and 15 correspond to a unitary transfer gate of the transfer gate group 110, the sense amplifier 16 forms a unitary sense amplifier of the sense amplifier 102, and the memory cell array 17 corresponds to the memory cell array 100.

With the above mentioned arrangement, if the data transfer control signal line are 18 brought to a high level 18, the NMOS transistors 14 and 15 are turned on, so that a plurality of data bits are simultaneously transferred to the data register group, from which the plurality of data bits are serially read out through the serial input/output port. Thus, it is possible to perform a serial data reading from the memory cell array 17. Similarly, it is possible to perform a serial data writing to the memory cell array 17.

In the above mentioned conventional serial access semiconductor memory, as will be apparent from FIG. 2, one data register 13 is provided for one sense amplifier 16 in one-to-one relation, so as to constitute one unitary data register circuit. Accordingly, a number of unitary data register circuits each of which is formed as shown in FIG. 2 are associated to the memory cell array. In other words, there exist unitary data register circuits of the number corresponding to the number of complementary bit line pairs, namely, the number of sense amplifiers provided in the memory cell array.

This is disadvantageous in that if the capacity of the semiconductor memory is increased, the circuit scale of the semiconductor memory is correspondingly increased. In addition, with advance of microminiaturization in a semiconductor memory manufacturing process, if the degree of microminiaturization in the memory cell and the degree of microminiaturization in peripheral circuits including the data buffers become different, the arrangement of the conventional serial access semiconductor memory will make it difficult to locate the data buffers in association with the memory cell array.

SUMMARY OF THE INVENTION

Accordingly, it is an object of the present invention to provide a serial access semiconductor memory which has overcome the above mentioned defect of the conventional one.

Another object of the present invention is to provide a serial access semiconductor memory having data registers of the necessary and sufficient number which is smaller than the number of sense amplifiers in the memory cell array, but capable of ensuring a smooth data transfer in the serial input/output operation comparable to that of the conventional serial access semiconductor memory.

Still another object of the present invention is to provide a serial access semiconductor memory capable of rationally locating sense amplifiers and data registers even if the degree of microminiaturization in the memory cell and the degree of microminiaturization in peripheral circuits including the data buffers are different, to the effect that the data transfer in the serial input/output operation can be smoothly performed similarly to the conventional serial access semiconductor memory.

The above and other objects of the present invention are achieved in accordance with the present invention by a serial access semiconductor memory comprising:

a memory cell array having a number of complementary bit line pairs, each of complementary bit line pairs being coupled to a sense amplifier so that a potential difference in the complementary bit line pair is amplified by the sense amplifier;

a plurality of data registers each of which is connected to each "m" complementary bit line pairs of the memory cell array through corresponding "m" transfer gates, which are controlled by "m" different data transfer control signal lines, respectively, so that the "m" complementary bit line pairs are sequentially connected to the one data register one at a time, by sequentially activating the "" different data transfer control signal lines one at a time, where "m" is a positive integer not less than 2, and a serial data input/output signal line pair connected in common to all of the data registers so that data held in the data registers can be serially outputted from the respective data registers through the serial data input/output signal line pair by sequentially activating the data registers one at a time.

In a preferred embodiment, the serial access semiconductor memory in accordance with the present invention comprises a memory cell array having a number of pairs of complementary bit lines, a pair of complementary serial data input/output signal lines, and a plurality of unitary circuits. Each of the unitary circuits includes at least a first sense amplifier connected to a first pair of complementary bit lines of the memory cell array for amplifying a potential difference between the first pair of complementary bit lines of the memory cell array, a second sense amplifier connected to a second pair of complementary bit lines of the memory cell array for amplifying a potential difference between the second pair of complementary bit lines of the memory cell array, a first transfer gate circuit having a first pair of input/output terminals, a second pair of input/output terminals and a control terminal, the first pair of input/output terminals being connected to the first pair of complementary bit lines of the memory cell array, the control terminal being connected to a first data transfer control signal line, a second transfer gate circuit having a first pair of input/output terminals, a second pair of input/output terminals and a control terminal, the first pair of input/output terminals being connected to the second pair of complementary bit lines of the memory cell array, the control terminal being connected to a second data transfer control signal line, and a data register having a first pair of complementary data input/output terminals connected in common to the second pair of input/output terminals of each of the first and second transfer gate circuits, and a second pair of complementary data input/output terminals connected to the pair of complementary serial data input/output signal lines, the data register being controlled by a corresponding individual serial input/output control signal line so as to couple the first pair of complementary data input/output terminals to the second pair of complementary data input/output terminals in a signal transmission relation. With this arrangement, data on the bit line pairs can be serially outputted through the pair of complementary serial data input/output signal lines, by sequentially activating the first and second data transfer control signal lines one at a time and by sequentially activating the individual serial input/output control signal line of the data register of each of the plurality of unitary circuits one at a time in such a manner that after one of the first and second data transfer control signal lines is activated, the individual serial input/output control signal line of the data register of each of all the plurality of unitary circuits is sequentially activated one at a time.

The above and other objects, features and advantages of the present invention will be apparent from the following description of preferred embodiments of the invention with reference to the accompanying drawings.

DESCRIPTION OF THE PREFERRED EMBODIMENTS

Figure 3:
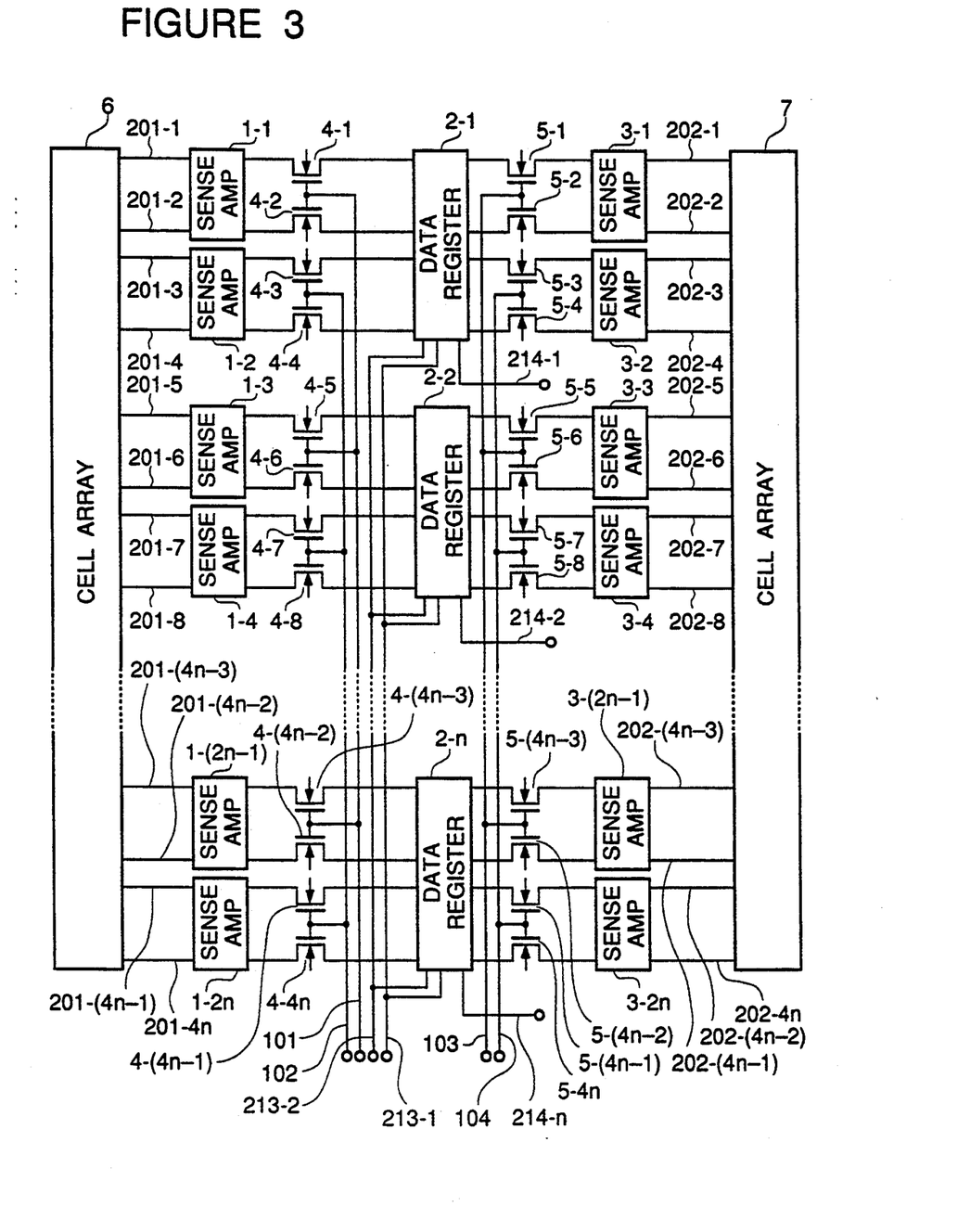
FIG. 3 is a block diagram of one embodiment of the serial access semiconductor memory in accordance with the present invention.

Referring to FIG. 3, there is shown a block diagram of one embodiment of the serial access semiconductor memory in accordance with the present invention.

In the shown embodiment, a memory cell array is divided into a left cell array 6 and a right cell array 7, each of which includes "2n" pairs of complementary bit lines, where "n" is a positive integer, preferably a positive integer not less than 2. Namely, the left cell array 6 has a first pair of complementary bit lines 201-1 and 201-2, a second pair of complementary bit lines 201-3 and 201-4, a third pair of complementary bit lines 201-5 and 201-6, a fourth pair of complementary bit lines 201-7 and 201-8, . . . , a (2n-1)th pair of complementary bit lines 201-(4n-3) and 201-(4n-2), and a (n)th pair of complementary bit lines 201-(4n-1) and 201-4n. The right cell array 7 includes a first pair of complementary bit lines 202-1 and 202-2, a second pair of complementary bit lines 202-3 and 202-4, a third pair of complementary bit lines 202-5 and 202-6, a fourth pair of complementary bit lines 202-7 and 202-8, . . . , a (2n-1)th pair of complementary bit lines 202-(4n-3) and 202-(4n-2), and a (n)th pair of complementary bit lines 202-(4n-1) and 202-4n.

Each pair of complementary bit lines 201-1 and 201-2, 201-3 and 201-4, 201-5 and 201-6, 201-7 and 201-8, . . . , 201-(4n-3) and 201-(4n-2), and 201-(4n-1) and 201-4n are connected through a corresponding sense amplifier 1—1, 1-2, 1-3, 1-4, . . . , 1-(2n-1), and 1-2n to respective sources of a corresponding pair of NMOS transistors 4-1 and 4-2, 4-3 and 4—4, 4-5 and 4-6, 4-7 and 4-8, . . . , 4-(4n-3) and 4-(4n-2), and 4-(4n-1) and 4-4n. In each of these NMOS transistor pairs, a gate of one transistor are connected to a gate of the other transistor. In addition, each pair of complementary bit lines 202-1 and 202-2, 202-3 and 202-4, 202-5 and 202-6, 202-7 and 202-8, . . . , 202-(4n-3) and 202-(4n-2), and 202-(4n-1) and 202-4n are connected through a corresponding sense amplifier 3-1, 3-2, 3—3, 3-4, . . . , 3-(2n-1), and 3-2n to respective sources of a corresponding pair of NMOS transistors 5-1 and 5-2, 5-3 and 5-4, 5—5 and 5-6, 5-7 and 5-8, . . . , 5-(4n-3) and 5-(4n-2), and 5-(4n-1) and 5-4n. In each of these NMOS transistor pairs, a gate of the transistors are connected to each other.

The gates of the NMOS transistor pairs 4-1 and 4-2, 4-5 and 4-6, ..., 4-(4n-3) and 4-(4n-2) are connected to a first data transfer control signal line 101, and the gates of the NMOS transistor pairs 4-3 and 4—4, 4-7 and 4-8, ..., 4-(4n-1) and 4-4n are connected to a second data transfer control signal line 102. Furthermore, the gates of the NMOS transistor pairs 5-1 and 5-2, 5—5 and 5-6, ..., 5-(4n-3) and 5-(4n-2) are connected to a third data transfer control signal line 103, and the gates of the NMOS transistor pairs 5-3 and 5-4, 5-7 and 5-8, ..., 5-(4n-1) and 5-4n are connected to a fourth data transfer control signal line 104. The above mentioned NMOS transistors and the sense amplifiers are located in an area between the cell arrays 6 and 7.

The shown embodiment also includes "n" data registers 2-1, 2-2, ..., 2-n arranged at a center of the area between the cell arrays 6 and 7. Each of the "n" data registers 2-1, 2—2, ..., 2-n is connected in common to a pair of complementary serial input/output data signal lines 213-1 and 213-2, and is also connected to a corresponding individual serial input/output control signal line 214-k ($1 \leq k \leq n$). Furthermore, the first data register 2-1 is connected to a drain of each of four pairs of NMOS transistors 4-1 and 4-2, 4-3 and 4—4, 5-1 and 5-2, and 5-3 and 5-4, and the second data register 2—2 is connected to a drain of each of four pairs of NMOS transistors 4-5 and 4-6, 4-7 and 4-8, 5—5 and 5-6, and 5-7 and 5-8. Similarly, each of the other data registers is connected to a drain of each of corresponding four pairs of NMOS transistors, so that the (n)th data register 2-n is connected to a drain of each of four pairs of NMOS transistors 4-(4n-3) and 4-(4n-2), 4-(4n-1) and 4-4n, 5-(4n-3) and 5-(4n-2) and 5-(4n-1) and 5-4n.

As will be apparent from the above description with reference to FIG. 3, each pair of NMOS transistors constitute one transfer gate between one associated sense amplifier and a corresponding one data register in common to each four sense amplifiers. In other words, each of the data registers is associated with four sets of circuits each of which includes one transfer gate and one sense amplifier connected to a pair of complementary bit lines of the memory cell array.

Figure 4:
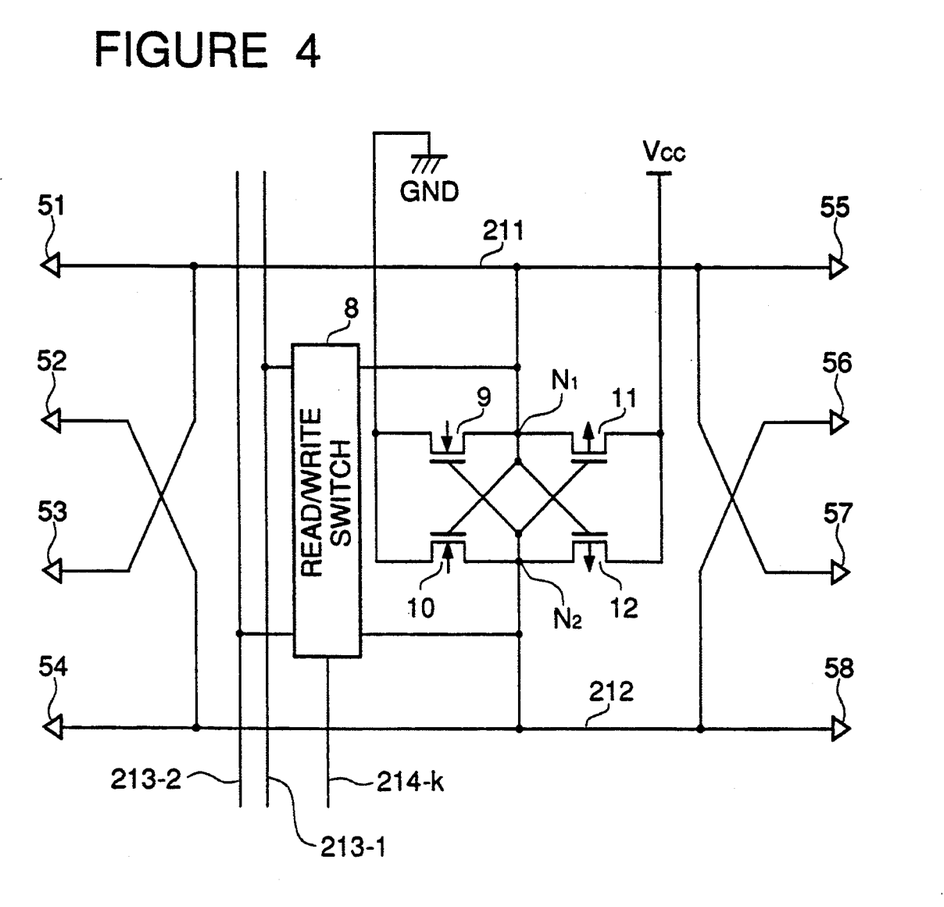
FIG. 4 is a circuit diagram of one example of the data register incorporated in the serial access memory shown in FIG. 3.

Referring to FIG. 4, there is shown a circuit diagram of the data registers 2-1, 2—2, ..., 2-n incorporated in the serial access memory shown in FIG. 3.

As shown in FIG. 4, each of the data registers 2-1, 2—2, ..., 2-n includes four pairs of input/output terminals 51 and 52, 53 and 54, 55 and 56, and 57 and 58. The input/output terminals 51, 53, 55 and 57 are connected in common to a data register data line 211, and the input/output terminals 52, 54, 56 and 58 are connected in common to another data register data line 212 complementary to the data register data line 211.

A flipflop formed of NMOS transistors 9 and 10 and PMOS transistor 11 and 12 is connected between a positive voltage supply line Vcc and the ground GND. The flipflop has a pair of complementary data nodes $N_1$ and $N_2$ connected to the pair of complementary data register data lines 211 and 212, respectively. Specifically, the positive voltage supply line Vcc is connected to a source of each of the PMOS transistors 11 and 12, and the ground is connected to a source of each of the PMOS transistors 9 and 10. The node $N_1$ connected to the data register data line 211 is connected to a drain of the NMOS transistor 9, a gate of the NMOS transistor 10, a drain of the PMOS transistor 11 and a gate of the PMOS transistor 12, and the node $N_2$ connected to the data register data line 212 is connected to a gate of the NMOS transistor 9, a drain of the NMOS transistor 10, a gate of the PMOS transistor 11 and a drain of the PMOS transistor 12.

Furthermore, the pair of complementary serial input/output data signal lines 213-1 and 213-2 are connected to the pair of complementary data register data lines 211 and 212, respectively, through a read/write switch 8 controlled by the serial input/output control line 214-k ($1 \leq k \leq n$).

Here, for example, assuming that the data register 2-1 shown in FIG. 3 is constituted of the circuit shown in FIG. 4, the input/output terminals 51 and 52 are connected to the drain of the NMOS transistors 4-1 and 4-2, respectively, and the input/output terminals 53 and 54 are connected to the drain of the NMOS transistors 4-3 and 4—4, respectively. The input/output terminals 55 and 56 are connected to the drain of the NMOS transistors 5-1 and 5-2, respectively, and the input/output terminals 57 and 58 are connected to the drain of the NMOS transistors 5-3 and 5-4, respectively.

Thus, in the circuit shown in FIG. 4, one item of data, namely, one bit of data in a complementary form, is supplied onto the pair of complementary data register data lines 211 and 212 from a selected one pair of the four pairs of input/output terminals 51 and 52, 53 and 54, 55 and 56, and 57 and 58, and is held in the flipflop composed of the transistors 9, 10, 11 and 12. The item of data is transferred to the pair of complementary serial input/output data signal lines 213-1 and 213-2 through the read/write switch 8 controlled by the serial input/output control line 214-k, if the pair of complementary serial input/output data signal lines 213-1 and 213-2 have been precharged or have a small potential difference therebetween. Thus, the same potential difference as that between the pair of complementary data register data lines 211 and 212 is outputted between the pair of complementary serial input/output data signal lines 213-1 and 213-2.

On the other hand, when a sufficient potential difference exists between the pair of complementary serial input/output data signal lines 213-1 and 213-2, this potential difference is transferred between the nodes $N_1$ and $N_2$ through the read/write switch 8 controlled by the serial input/output control line 214-k, so that the potential difference is stored in the flipflop. In addition, this potential difference is emphasized by an amplification action of the flipflop itself. The emphasized potential difference held in the flipflop is transferred to the pair of complementary data register data lines 211 and 212.

As will be apparent form the above description, by sequentially bringing the serial input/output control signal lines 214-k ($1 \leq k \leq n$) to a high level, the data held in the respective data registers is serially outputted to the pair of complementary serial input/output data signal lines 213-1 and 213-2. Accordingly, in the serial access memory shown in FIG. 3, "4n" items of data are serially outputted by sequentially bringing the data transfer control signal lines 101, 102, 103 and 104 to a high level, and by sequentially bringing the serial input/output control signal lines 214-1, 214-2, ..., 214-n to the high level in the manner which will be described in detail hereinafter.

In the serial access memory shown in FIG. 3, if a minute potential difference occurs between the pair of complementary bit lines 201-1 and 201-2, the potential difference is amplified by the associated sense amplifier 1—1 to the effect that one of the complementary bit lines 201-1 and 201-2 is pulled up to a voltage supply voltage Vcc and the other of the complementary bit lines 201-1 and 201-2 is pulled down to a ground potential. Accordingly, after the potential difference between the pair of complementary bit lines 201-1 and 201-2 is enlarged by the sense amplifier 1—1 to a sufficient magnitude, the data transfer control signal 101 is brought from a low level to a high level, so that one item of data on the pair of complementary bit lines 201-1 and 201-2 is fetched into the data register 2-1.

Similarly, an item of data can be fetched into the data register 2-1 through each of the other three sense amplifier 1-2, 3-1 and 3-2 by bringing each of the other three data transfer control signal lines 102, 103 and 104 to the high level. Therefore, by sequentially bringing the four data transfer control signal lines 101, 102, 103 and 104 to the high level one at a time, the output data of the four sense amplifiers 1—1, 1-2, 3-1 and 3-2 can be sequentially read out one at a time to the data register 2-1.

As shown in FIG. 4, the item of data supplied through the input terminals 51 and 52, 53 and 54, 55 and 56, or 57 and 58 is latched by the flipflop composed of NMOS transistors 9 and 10 and the NMOS transistors 11 and 12. This item of data latched in the flipflop is outputted through the read/write switch 8 to the pair of complementary serial input/output data signal lines 213-1 and 213-2.

In the shown embodiment in which the four sense amplifiers are connected to each one data register, by activating any one of the four data transfer control signal lines 101, 102, 103 and 104 to the high level after the sense amplifiers have been activated, the output data of the sense amplifier selected by the activated data transfer control signal line is latched into for example the data register 2-1.

In the above mentioned manner, each one item of data is latched into each of the "n" data registers 2-1, 2—2, ..., 2-n. In this condition, if one serial input/output signal control line 214-k is activated to the high level, one item of data is outputted to the pair of complementary serial input/output data signal lines 213-1 and 213-2 from the data register connected to the activated serial input/output signal control line 214-k, Therefore, by sequentially activating the serial input/output signal control lines 214-k ($1 \leq k \leq n$) one at a time, the "n" items of data are serially outputted from the "n" data registers 2-1, 2—2, ..., 2-n to the pair of complementary serial input/output data signal lines 213-1 and 213-2.

After the data of all the "n" data registers 2-1, 2—2, ..., 2-n have been outputted to the pair of complementary serial input/output data signal lines 213-1 and 213-2, the data transfer control signal line 102 is activated to the high level, so that the data stored in the "n" data registers is rewritten from the data of the "n" sense amplifiers 1—1, 1-3, ..., 1-(2n-1) to the data of the "n" sense amplifiers 1-2, 1-4, ..., 1-2n.

If the above mentioned operation is repeated for each of the data transfer control signal lines 101, 102, 103 and 104, the data of all the "44n" sense amplifiers can continuously and serially outputted to the pair of complementary serial input/output data signal lines 213-1 and 213-2. Namely, the "4n" items of data are serially outputted by sequentially bringing the data transfer control signal lines 101, 102, 103 and 104 to a high level, and by sequentially bringing the serial input/output control signal lines 214-1, 214-2, ..., 214-n to the high level in such a manner that: First, the data transfer control signal line 101 is brought to a high level, so that first "n" items of data are transferred from the "n" sense amplifiers 1—1, 1-3, ..., 1-(2n-1) to the data registers 2-1, 2—2, ..., 2-n, respectively, and then, the serial input/output control signal lines 214-1, 214-2, ..., 214-n are sequentially brought to the high level one at a time, so that the "n" items of data temporarily held in the data registers 2-1, 2—2, ..., 2-n, respectively, are serially outputted through the pair of complementary serial input/output data signal lines 213-1 and 213-2; Secondly, the data transfer control signal line 102 is brought to a high level, so that second "n" items of data are transferred from the "n" sense amplifiers 1-2, 1-4, ..., 1-2n to the data registers 2-1, 2—2, ..., 2-n, respectively, and then, the serial input/output control signal lines 214-1, 214-2, ..., 214-n are sequentially brought to the high level one at a time, so that the second "n" items of data temporarily held in the data registers 2-1, 2—2, ..., 2-n, respectively, are serially outputted through the pair of complementary serial input/output data signal lines 213-1 and 213-2; Thirdly, the data transfer control signal line 103 is brought to a high level, so that third "n" items of data are transferred from the "n" sense amplifiers 3-1, 3—3, ..., 3-(2n-1) to the data registers 2-1, 2—2, ..., 2-n, respectively, and then, the serial input/output control signal lines 214-1, 214-2, ..., 214-n are sequentially brought to the high level one at a time, so that the third "n" items of data temporarily held in the data registers 2-1, 2—2, ..., 2-n, respectively, are serially outputted through the pair of complementary serial input/output data signal lines 213-1 and 213-2; Fourthly, the data transfer control signal line 104 is brought to a high level, so that fourth "n" items of data are transferred from the "n" sense amplifiers 3-2, 3-4, ..., 3-2n to the data registers 2-1, 2—2, ..., 2-n, respectively, and then, the serial input/output control signal lines 214-1, 214-2, ..., 214-n are sequentially brought to the high level one at a time, so that the fourth "n" items of data temporarily held in the data registers 2-1, 2—2, ..., 2-n, respectively, are serially outputted through the pair of complementary serial input/output data signal lines 213-1 and 213-2.

In the case of writing, on the other hand, continuously changing data on the pair of complementary serial input/output data signal lines 213-1 and 213-2 is continuously latched in the "n" data registers 2-1, 2—2, ..., 2-n in such a manner that one item of data is latched in one data register at a time, by sequentially activating the serial input/output control signal lines 214-1, 214-2, ..., 214-n, one at a time. After all of the "n" data registers 2-1, 2—2, ..., 2-n have been written with data, one of the data transfer control signal lines 101, 102, 103 and 104, for example, the data transfer control signal line 101 is activated to the high level, so that the data items held in the "n" data registers 2-1, 2—2, ..., 2-n, respectively, are outputted, in parallel, to the bit line pair of the sense amplifiers 1—1, 1-3, ..., 1-(2n-1) selected by the activated data transfer control signal line 101. Thereafter, these sense amplifiers are activated, the data item on each bit line pair is emphasized and fixed. The above mentioned operation is repeated for each of the remaining three data transfer control signal lines 102, 103 and 104. As a result, the data is rewritten to all the "4n" sense amplifiers. Thereafter, the data of all the "4n" sense amplifiers can be written to the memory cell array composed of the cell arrays 6 and 7 in a manner well known to persons skilled in the art.

In the above mentioned embodiment, each one data register is connected to the four bit line pairs through the corresponding four sense amplifiers and the corresponding four transfer gates controlled by the four different data transfer control signal lines, respectively. Therefore, the required number of the data registers can be reduced to one fourth of the number of the sense amplifiers and hence the bit lines pairs of the memory cell array. Even if the degree of microminiaturization in the memory cell and the degree of microminiaturization in peripheral circuits including the data buffers become different as the result of advance of microminiaturization in a semiconductor memory manufacturing process, the sense amplifiers and data registers can be rationally located to the effect that the data transfer in the serial input/output operation can be smoothly performed similarly to the conventional serial access semiconductor memory.

In the above mentioned embodiment, each one data register is connected with the four bit line pairs through the corresponding four transfer gates controlled by the four data transfer control signal lines, respectively, and through the corresponding four sense amplifiers. However, it would be apparent to persons skilled in the art that the embodiment can be easily modified so that each one data register is connected with two bit line pairs through corresponding two transfer gates controlled by two data transfer control signal lines, respectively, and through corresponding two sense amplifiers. This can be simply realized for example by deleting the bit line pairs 201-3 and 201-4, 201-7 and 201-8, ..., 201-(4n-1) and 201-4n and 202-3 and 202-4, 202-7 and 202-8, ..., 202-(4n-1) and 202-4n and their associated sense amplifiers and transfer gates and the data transfer control signal lines 102 and 104, in the circuit shown in FIG. 3, and by deleting the input/output terminals 53 and 54 and 57 and 58 in each data register circuit shown in FIG. 4, if both of the memory cells 6 and 7 are maintained. Alternatively, This can be simply realized for example by deleting the memory cell 7 and its associated bit line pairs 202-1 and 202-2, 202-3 and 202-4, ..., 201-(4n-3) and 201-(4n-2), and 202-(4n-1) and 202-4n and associated sense amplifiers and transfer gates and the data transfer control signal lines 103 and 104, in the circuit shown in FIG. 3, and by deleting the input/output terminals 55 and 56 and 57 and 58 in each data register circuit shown in FIG. 4.

Furthermore, it would be also apparent to persons skilled in the art that the embodiment can be easily modified so that each one data register is connected with six or more bit line pairs by increasing the number of the input/output terminal pairs in the circuit shown in FIG. 4.

The invention has thus been shown and described with reference to the specific embodiments. However, it should be noted that the present invention is in no way limited to the details of the illustrated structures but changes and modifications may be made within the scope of the appended claims.

We claim:

1. A serial access semiconductor memory comprising:
   a memory cell array having a number of complementary bit line pairs, each of complementary bit line pairs being coupled to a sense amplifier so that a potential difference in the complementary bit line pair is amplified by said sense amplifier;
   a plurality of data registers each of which is connected to each "m" complementary bit line pairs of said memory cell array through corresponding "m" transfer gate circuits, which are controlled by "m" different data transfer control signal lines, respectively, so that said "m" complementary bit line pairs are sequentially connected to one of said data registers one at a time, by sequentially activating said "m" different data transfer control signal lines one at a time, where "m" is a positive integer not less than 2, and
   a serial data input/output signal line pair connected in common to all of said data registers so that data held in said data registers can be serially outputted from the respective data registers through said serial data input/output signal line pair by sequentially activating said data registers one at a time.

2. A serial access semiconductor claimed in claim 1 wherein said data registers are connected to different serial input/output control signal lines, respectively, which are sequentially activated one at a time.

3. A serial access semiconductor memory comprising:
   a memory cell array having a first cell array and a second cell array, each of which includes a number of bit line pairs;
   a serial data input/output signal line pair; and
   a plurality of unitary circuits each of which includes:
   a first sense amplifier connected to a first bit line pair of said first cell array for amplifying a potential difference in said first bit line pair of said first cell array;
   a second sense amplifier connected to a second bit line pair of said first cell array for amplifying a potential difference in said second bit line pair of said first cell array;
   a third sense amplifier connected to a first bit line pair of said second cell array for amplifying a potential difference in said first bit line pair of said second cell array;
   a fourth sense amplifier connected to a second bit line pair of said second cell array for amplifying a potential difference in said second bit line pair of said second cell array;
   a first transfer gate having a first input/output terminal pair, a second input/output terminal pair and a control node, said first input/output terminal pair being connected to said first bit line pair of said first cell array, said control node being connected to a first data transfer control signal line;
   a second transfer gate having a first input/output terminal pair, a second input/output terminal pair and a control node, said first input/output terminal pair being connected to said second bit line pair of said first cell array, said control node being connected to a second data transfer control signal line;
   a third transfer gate having a first input/output terminal pair, a second input/output terminal pair and a control node, said first input/output terminal pair being connected to said first bit line pair of said cell array, said control node being connected to a third data transfer control signal line;
   a fourth transfer gate having a first input/output terminal pair, a second input/output terminal pair and a control node, said first input/output terminal pair being connected to said second bit line pair of said second cell array, said control node being connected to a fourth data transfer control signal line; and a data register having a first data input/output terminal pair connected to said second input/output terminal pair of each of said first to fourth transfer gates, and a second data input/output terminal pair connected to said serial data input/output signal line pair, said data register being controlled by a corresponding individual serial input/output control signal line so as to couple said first data input/output terminal pair to said second data input/output terminal pair in a signal transmission relation, whereby, data on the bit line pairs can be serially outputted through said serial data input/output signal line pair, by sequentially activating said first to fourth data transfer control signal lines one at a time and by sequentially activating said individual serial input/output control signal line of said data register of each of said plurality of unitary circuits one at a time in such a manner that after one of said first to fourth data transfer control signal lines is activated, said individual serial input/output control signal line of said data register of each of all said plurality of unitary circuits is sequentially activated one at a time.

4. A serial access semiconductor memory as claimed in claim 3,
wherein in said data register of each of said plurality of unitary circuits, said first data input/output terminal pair includes a first pair of complementary data input/output terminals, and said second data input/output terminal pair includes a second pair of complementary data input/output terminals, and said serial data input/output signal line pair includes a pair of complementary serial data input/output signal lines, and wherein said data register of each of said plurality of unitary circuits includes a flipflop having a pair of complementary data input/output nodes connected to said first pair of complementary data input/output terminals, respectively, and a read/write switch circuit having a first pair of input/output terminals connected to said first pair of complementary data input/output terminals, and a second pair of input/output terminals connected to said pair of complementary serial data input/output signal lines, said read/write switch circuit being connected to said corresponding individual serial input/output control signal line so as to connect said first pair of input/output terminals to said second pair of input/output terminals, respectively, when said corresponding individual serial input/output control signal line is activated.

5. A serial access semiconductor memory as claimed in claim 4, wherein said flipflop includes:
a first PMOS transistor having its source connected to a positive voltage, its gate connected to one node of said pair of complementary data input/output nodes, and its drain connected to another node of said pair of complementary data input/output nodes;
a second PMOS transistor having its source connected to said positive voltage, its gate connected to the other node of said pair of complementary data input/output nodes, and its drain connected to said one node of said pair of complementary data input/output nodes;
a first NMOS transistor having its source connected to the ground, its gate connected to said one node of said pair of complementary data input/output nodes, and its drain connected to the other node of said pair of complementary data input/output nodes; and
a second NMOS transistor having its source connected to ground, its gate connected to the other node of said pair of complementary data input/output nodes, and its drain connected to said one node of said pair of complementary data input/output nodes.

6. A serial access semiconductor memory comprising:
a memory cell array having a number of pairs of complementary bit lines;
a pair of complementary serial data input/output signal lines; and
a plurality of unitary circuits each of which includes at least:
a first sense amplifier connected to a first pair of complementary bit lines of said memory cell array for amplifying a potential difference between said first pair of complementary bit lines of said memory cell array;
a second sense amplifier connected to a second pair of complementary bit lines of said memory cell array for amplifying a potential difference between said second pair of complementary bit lines of said memory cell array;
a first transfer gate circuit having a first pair of input/output terminals, a second pair of input/output terminals and a control terminal, said first pair of input/output terminals being connected to said first pair of complementary bit lines of said memory cell array, said control terminal being connected to a first data transfer control signal line;
a second transfer gate circuit having a first pair of input/output terminals, a second pair of input/output terminals and a control terminal, said first pair of input/output terminals being connected to said second pair of complementary bit lines of said memory cell array, said control terminal being connected to a second data transfer control signal line; and
a data register having a first pair of complementary data input/output terminals connected in common to said second pair of input/output terminals of each of said first and second transfer gate circuits, and a second pair of complementary data input/output terminals connected to said pair of complementary serial data input/output signal lines, said data register being controlled by a corresponding individual serial input/output control signal line so as to couple said first pair of complementary data input/output terminals to said second pair of complementary data input/output terminals in a signal transmission relation, whereby, data on the bit line pairs can be serially outputted through said pair of complementary serial data input/output signal lines, by sequentially activating said first and second data transfer control signal lines one at a time and by sequentially activating said individual serial input/output control signal line of said data register of each of said plurality of unitary circuits one at a time in such a manner that after one of said first and second data transfer control signal lines is activated, said individual serial input/output control signal line of said data register of each of all said plurality of unitary circuits is sequentially activated one at a time.

7. A serial access semiconductor memory as claimed in claim 6, wherein said data register of each of said plurality of unitary circuits includes a flipflop having a pair of complementary data input/output nodes connected to said first pair of complementary data input/output terminals, respectively, and a read/write switch circuit having a first pair of input/output terminals connected to said first pair of complementary data input/output terminals, and a second pair of input/output terminals connected to said pair of complementary serial data input/output signal lines, said read/write switch circuit being connected to said corresponding individual serial input/output control signal line so as to connect said first pair of input/output terminals to said second pair of input/output terminals, respectively, when said corresponding individual serial input/output control signal line is activated.

8. A serial access semiconductor memory as claimed in claim 7, wherein said flipflop includes:

a first PMOS transistor having its source connected to a positive voltage, its gate circuit connected to one node of said pair of complementary data input/output nodes, and its drain connected to another node of said pair of complementary data input/output nodes;

a second PMOS transistor having its source connected to said positive voltage, its gate circuit connected to the other node of said pair of complementary data input/output nodes, and its drain connected to said one node of said pair of complementary data input/output nodes;

a first NMOS transistor having its source connected to ground, its gate circuit connected to said one node of said pair of complementary data input/output nodes, and its drain connected to the other node of said pair of complementary data input/output nodes; and a second NMOS transistor having its source connected to the ground, its gate circuit connected to the other node of said pair of complementary data input/output nodes, and its drain connected to said one node of said pair of complementary data input/output nodes.

* * * * *

UNITED STATES PATENT AND TRADEMARK OFFICE
CERTIFICATE OF CORRECTION

PATENT NO. : 5,377,155
DATED : December 27, 1994
INVENTOR(S) : Tamaki et al.

It is certified that error appears in the above-identified patent and that said Letters Patent is hereby corrected as shown below:

Column 1, line 20, delete "clumns" and insert --columns--;
Column 7, line 60, after "can" and insert --be--.

Signed and Sealed this

Thirteenth Day of June, 1995

Attest:

BRUCE LEHMAN

Attesting Officer     Commissioner of Patents and Trademarks